United States Patent [19]

Hara

[11] Patent Number: 5,045,427

[45] Date of Patent: * Sep. 3, 1991

[54] PHOTOGRAPHIC MATERIAL CONTAINING NON-PHOTOSENSITIVE SILVER SALT

[75] Inventor: Hiroshi Hara, Kanagawa, Japan

[73] Assignee: Fuji Photo Film Co., Ltd., Kanagawa, Japan

[*] Notice: The portion of the term of this patent subsequent to Dec. 16, 2003 has been disclaimed.

[21] Appl. No.: 363,312

[22] Filed: Jun. 7, 1989

Related U.S. Application Data

[63] Continuation of Ser. No. 220,872, Jul. 18, 1988, abandoned, which is a continuation of Ser. No. 879,747, Jun. 27, 1986, abandoned.

[30] Foreign Application Priority Data

Jun. 28, 1985 [JP] Japan .................................. 60-141799

[51] Int. Cl.$^5$ .......................... G03C 5/54; G03C 1/06; G03C 7/16
[52] U.S. Cl. .................................... 430/138; 430/203; 430/351; 430/617; 430/619
[58] Field of Search ............... 430/138, 203, 351, 617, 430/619

[56] References Cited

U.S. PATENT DOCUMENTS

| | | | |
|---|---|---|---|
| 4,624,910 | 11/1986 | Takeda | 430/203 |
| 4,629,676 | 12/1986 | Hayakawa et al. | 430/203 |
| 4,629,684 | 12/1986 | Sato et al. | 430/203 |
| 4,649,098 | 3/1987 | Takeda | 430/203 |
| 4,775,613 | 10/1988 | Hirai et al. | 430/203 |

FOREIGN PATENT DOCUMENTS 0203613 12/1986 European Pat. Off. ............ 430/203

*Primary Examiner*—Richard L. Schilling
*Attorney, Agent, or Firm*—Sughrue, Mion, Zinn, Macpeak & Seas

[57] ABSTRACT

The present invention provides a photographic material containing a non-photosensitive silver salt comprising a photosensitive silver halide, a non-photosensitive silver salt, a reducing agent, a polymerizable compound and a color image-forming substance provided on a support, wherein at least said polymerizable compound and said color image-forming substance are contained in the same microcapsules so that said color image-forming substance may be converted into an imagewise immobile state after the material has been imagewise exposed to light and then heated. Said material has a high sensitivity and may form a color image having an absorption in a visible range, by light-exposure for a short period of time followed by a dry and rapid photographic treatment.

8 Claims, No Drawings

PHOTOGRAPHIC MATERIAL CONTAINING NON-PHOTOSENSITIVE SILVER SALT

This is a continuation of application Ser. No. 07/220,872, filed July 18, 1988 which is a continuation of application Ser. No. 06/879,747 filed June 27, 1986, both now abandoned.

FIELD OF THE INVENTION

The present invention relates to a photographic material containing a non-photosensitive silver salt and microcapsules which have a polymerizable compound and a color image-forming substance as encapsulated therein. More particularly, the present invention relates to a photographic material containing a non-photosensitive silver salt which further contains a sensor of a photographic silver halide, characterized in that, when this is irradiated with a radiation, a latent image is formed on the silver halide whereby an image-like polymeric compound is formed from the polymerizable compound so that the co-existing image-forming substance is converted into an imagewise immobile state.

BACKGROUND OF THE INVENTION

Various kinds of recording materials containing microcapsules have heretofore been known.

For instance, Japanese Patent Publication No. 14344/67 (corresponding to U.S. Pat. No. 3,219,446) illustrates an image-transfer method wherein a photographic material sheet having a lot of small drops of fluids which may become non-fluid when irradiated to light is imagewise exposed to light and the exposed sheet is adhered to an image-receiving sheet, and a pressure is imparted to the whole of the laminated sheets whereby the image formed in accordance with the light-exposure is transferred on the image-receiving sheet.

Japanese Patent Application (OPI) No. 89915/52 (the term "OPI" as used herein means an "unexamined published patent application) illustrates a method for formation of an image, where one component of two component-type heat-sensitive coloring substances and a photopolymerizable monomer are encapsulated in microcapsules and the other component of the heat-sensitive coloring substances is blended with the microcapsules, and the resulting mixture is coated on a support sheet to obtain a photographic material sheet, and then, after the photographic material sheet is imagewise exposed to light thereby to harden the microcapsules in the exposed part, the whole surface of the photographic material sheet is heated to color the non-exposed part only, whereby a desired image is formed on the sheet.

Japanese Patent Application (OPI) Nos. 124343/82, 179836/82, and 197538/82 describe a method for formation of an image where microcapsules containing a vinyl compound, a photopolymerization initiator, and a dye-precursor are used, and the photographic material containing the components is pressed over the whole surface thereof, after having been imagewise exposed to light, to form a color image on the material, and this method does not require any heating step.

Japanese Patent Publication No. 20852/79 (corresponding to U.S. Pat. No. 3,700,439) describes an image-formation method using a photosensitive substance of Michler's ketone as encapsulated.

U.S. Pat. No. 3,072,481 illustrates a so-called light-sensitive and pressure-sensitive image-formation method, where a photosensitive substance which may easily be converted into a colored state when liquid, but is non-photosensitive when solid, is encapsulated, and the layer containing the encapsulated substance is imagewise exposed to light and thereafter, the capsules are ruptured under pressure to remove the solvent contained therein by evaporation, to thereby form an image on the layer.

Various means for the formation of images by the use of microcapsules have heretofore been known, as mentioned above. These conventional means, however, are defective in that the sensitivity to light is low in every case, and especially the sensitivity to green light or red light is extremely low. In addition, if the light-sensitivity is to be elevated in the conventional means, the preservation-stability is to become lowered on the other hand, which is another defect.

Regarding the formation of images by the use of a silver halide as a light sensor, various photographic materials except so-called conventional photographic materials have been known.

For instance, British Patent 866,631 describes a method for the direct photopolymerization by the use of a silver halide as a catalyst. In this method, it is considered that the product formed by the photolysis of the silver halide used will act as a catalyst in the polymerization, and the sensitivity is not so high as in the case for reduction of silver halides in a conventional development.

Belgian Patent 642,477 describes a method for the formation of images where light-exposed silver halide particles are developed with a conventional developer and thereafter polymerizable monomers are polymerized in the presence of the formed silver images or the non-reacted silver halides, which act as a catalyst in the polymerization, to form polymeric compounds in the form of images. This method is, however, defective in that it requires some complicated operations.

Japanese Patent Publication Nos. 11149/70, 20741/72, 10697/74, 138632/82, and 169143/83 describe a method for the formation of images in which light-exposed silver halides are developed with a reducing agent, whereupon co-existing vinyl compounds are begun to be polymerized simultaneously with the oxidation of the reducing agent to form polymeric substances in the form of images. This method is, however, also defective in that it requires a development step with liquids.

As mentioned above, various means for the formation of images by the use of silver halides as a light sensor have heretofore been known, all of which are, however, somewhat defective in that the sensitivity is low and that some complicated development steps are required.

SUMMARY OF THE INVENTION

An object of the present invention is to provide a non-photosensitive silver salt-containing photographic material of high sensitivity which may form a color image having an adsorption in a visible range, by light-exposure for a short period of time followed by a dry and rapid photographic treatment.

In order to attain the object, the present invention provides a photographic material containing a non-photosensitive silver salt comprising a photosensitive silver halide, a non-photosensitive silver salt, a reducing agent, a polymerizable compound and a color image-forming substance provided on a support, wherein at least the polymerizable compound and the color image-forming substance are contained in the same microcapsule so that the color image-forming substance may be converted into an imagewise immobile state after the material has been imagewise exposed to light and then heated.

DETAILED DESCRIPTION OF THE INVENTION

The features of the present invention are explained below in greater detail.

The photographic material containing a non-photosensitive silver salt of the present invention comprises a photosensitive silver halide, a non-photosensitive silver salt, a reducing agent, a polymerizable compound, and a color image-forming substance provided on a support. At least the polymerizable compound and the color image-forming substances are encapsulated in the same microcapsules so that the color image-forming substance may be converted into an imagewise immobile state after the material has been imagewise exposed to light and then heated.

In the photographic materials of the present invention comprising the constitution as mentioned above, the photosensitive silver halide acts as a light sensor and the latent image speck formed from the silver halide by the light-exposure acts as a catalyst and results in the oxidation-reduction reaction between the non-photosensitive silver salt and the reducing agent, whereupon a radical intermediate formed in the step or in the subsequent step acts as an initiator and results in the polymerization reaction of the polymerizable compound. The series of the reaction may be accelerated by heating, which is quite unexpected from any conventional technical knowledge.

In particular, the co-existence of the non-photosensitive silver salt has been found to accelerate the image-forming reaction, whereby photographic materials which require a light-exposure of an extremely short period of time and which are less dependent on a heating time in a photographic treatment may be obtained. This is a quite unexpected discovery.

The non-photosensitive silver salts to be used in the present invention are such silver substances contained in the photographic materials in such state that when the photographic material of the present invention, with the exception of only the photosensitive silver halide, is exposed to light in an amount larger than the minimum amount of light capable of converting the color image-forming substance in the photographic material of the present invention into an imagewise immobile state by 100 times, the conversion of the color image-forming substance into an imagewise immobile state does not occur.

Such non-photosensitive silver salts may be various kinds of substances, including, for example, silver salts of aliphatic or aromatic carboxylic acids, silver salts of mercapto group-containing compounds or of compounds having an α-hydrogen-containing thiocarbonyl group or silver salts of imino group-containing compounds.

Typical examples of silver salts of aliphatic carboxylic acids are silver salts derived from behenic acid, stearic acid, oleic acid, lauric acid, capric acid, myristic acid, palmitic acid, maleic acid, fumaric acid, tartaric acid, furoic acid, linoleic acid, linolenic acid, oleic acid, adipic acid, sebacic acid, succinic acid, acetic acid, butyric acid, or camphoric acid. Silver salts derived from halogen-substituted or hydroxyl-substituted derivatives of the fatty acids or from thioether group-containing fatty acids or carboxylic acids may also be used in the present invention.

Regarding silver salts of aromatic carboxylic acids and those of other carboxyl group-containing compounds, typical examples thereof are silver salts derived from benzoic acid, 3,5-dihydroxybenzoic acid, o-, m-, or p-methylbenzoic acid, 2,4-dichlorobenzoic acid, acetamidobenzoic acid, p-phenylbenzoic acid, gallic acid, tannic acid, phthalic acid, terephthalic acid, salicylic acid, phenyl-acetic acid, pyromellitic acid, or 3-carboxymethyl-4-methyl-4-thiazolin-2-thione.

Examples of silver salts of mercapto- or thiocarbonyl-containing compounds are silver salts derived from 3-mercapto-4-phenyl-1,2,4-triazole, 2-mercaptobenzimidazole, 2-mercapto-5-aminothiadiazole, 2-mercaptobenzothiazole, s-alkylthioglycollic acid (where alkyl group has from 12 to 22 carbon atoms), dithiocarboxylic acids, such as dithio-acetic acid, thioamides such as thiostearamide, 5-carboxy-1-methyl-2-phenyl-4-thiopyridine, mercapto-triazine, 2-mercaptobenzoxazole, mercaptoxadiazole, 3-amino-5-benzylthio-1,2,4-triazole, or the like mercapto compounds as described in U.S. Pat. No. 4,123,274.

Typical examples of silver salts of imino-containing compounds are silver salts derived from benzotriazole or derivatives thereof, for example, benzotriazole, alkyl-substituted benzotriazoles such as methylbenzotriazole, halogen-substituted benzotriazoles such as 5-chlorobenzotriazole or carboimidobenzotriazoles such as butylcarboimidobenzotriazole, as described in Japanese Patent Publication Nos. 30270/69 and 18416/70; nitrobenzotriazoles as described in Japanese Patent Application (OPI) No. 118639/83; sulfobenzotriazoles, carboxybenzotriazoles, or salts thereof, or hydroxybenzotriazoles as described in Japanese Patent Application (OPI) No. 118638/83; and 1,2,4-triazoles or 1H-tetrazoles, carbazoles, saccharins, imidazoles, and derivatives thereof, as described in U.S. Pat. No. 4,220,709.

In addition, silver salts as described in *Research Disclosure*, RD No. 17029 (June, 1978) as well as other organic metal salts than silver salts such as copper stearate and silver salts of alkynyl group-containing carboxylic acids such as phenyl-propiolic acid as described in Japanese Patent Application No. 221535/83 may also be used in the present invention.

Among the silver salts, those represented by formula (I) are especially preferred, as being remarkably effective for reduction of the heating time during photographic treatment of the photographic materials.

$$R-C\equiv C-Ag \qquad (I)$$

wherein R represents a substituted or unsubstituted alkyl group, cycloalkyl group, alkenyl group, alkynyl group, aralkyl group, aryl group, or heterocyclic group.

In particular, silver salts of formula (I) where R represents a substituted or unsubstituted phenyl group are especially effective.

Some specific examples of the silver salts of formula (I) are set forth below.

(1)

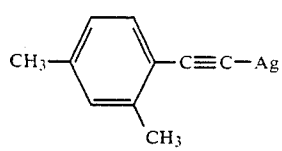 (2)
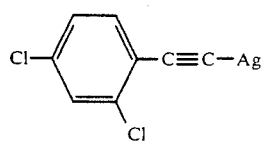 (3)
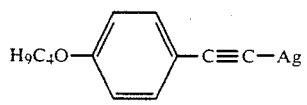 (4)
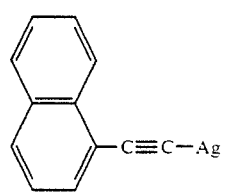 (5)
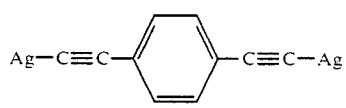 (6)
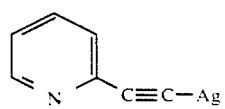 (7)
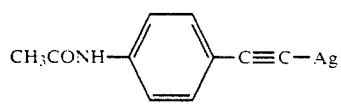 (8)
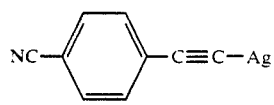 (9)
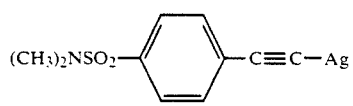 (10)
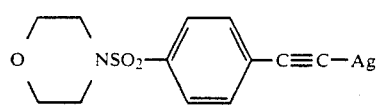 (11)
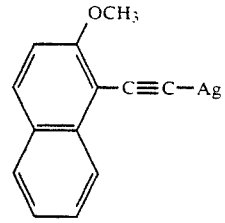 (12)
 (13)
 (14)
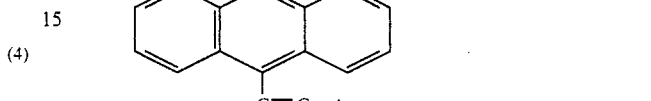 (15)
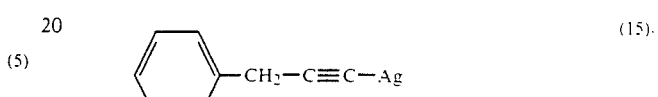 (16)
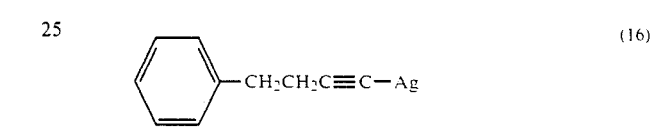 (17)
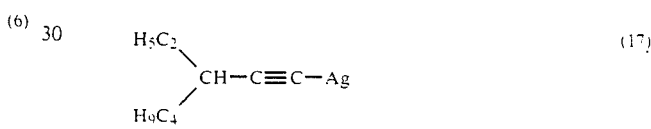 (18)
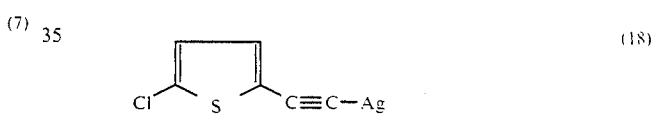 (19)
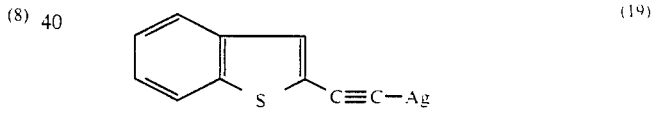 (20)
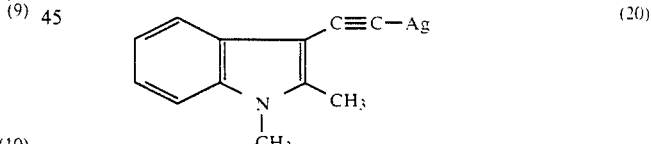 (21)
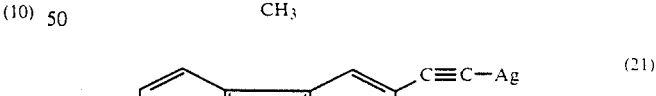 (22)
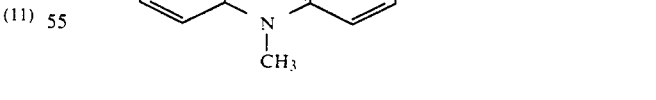 (23)
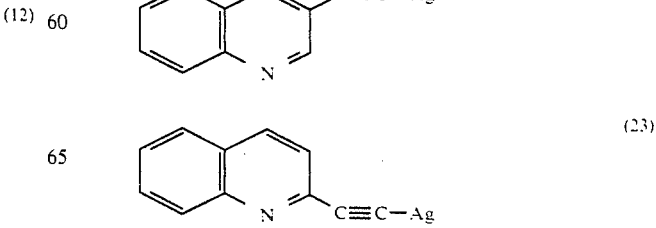

-continued
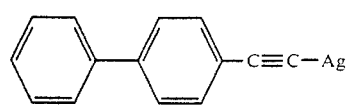 (24)
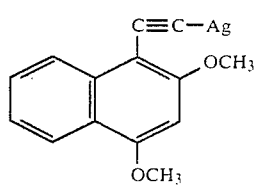 (25)
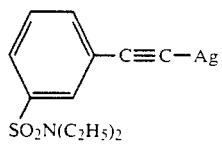 (26)
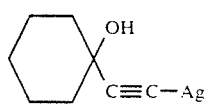 (27)
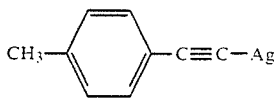 (28)
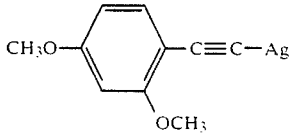 (29)
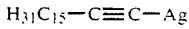 (30)
 (31)
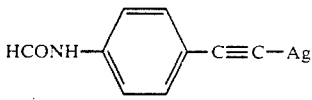 (32)
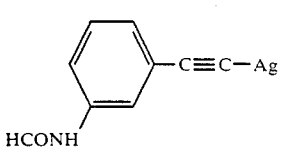 (33)
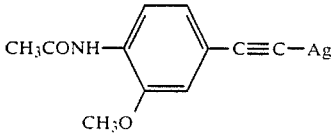 (34)
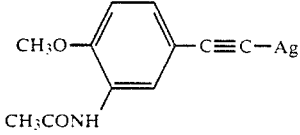 (35)
-continued
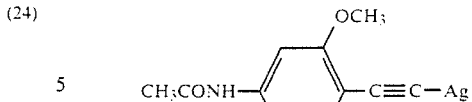 (36)
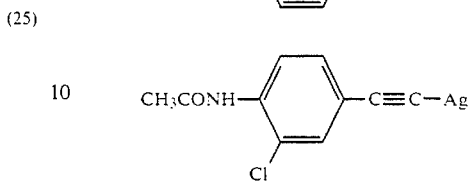 (37)
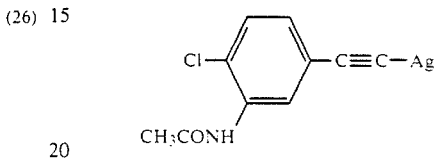 (38)
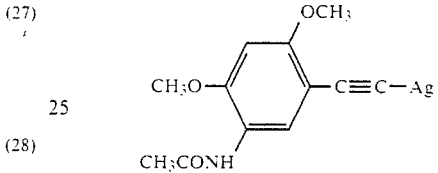 (39)
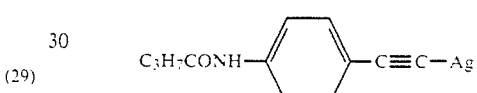 (40)
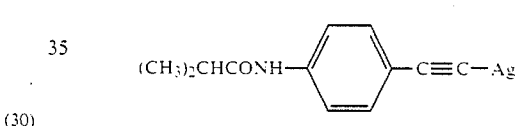 (41)
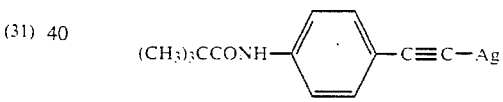 (42)
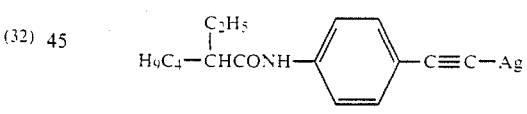 (43)
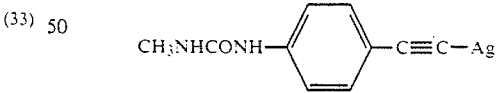 (44)
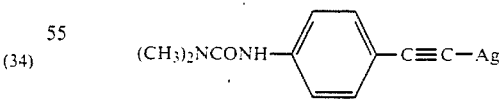 (45)
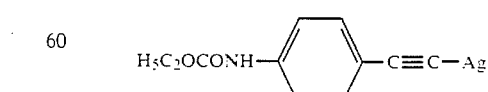 (46)
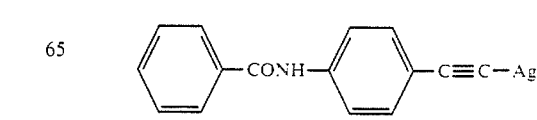 (47)

-continued
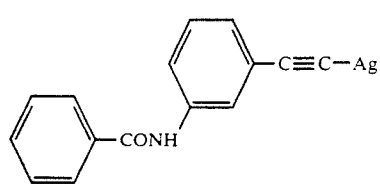 (48)
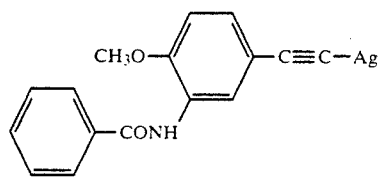 (49)
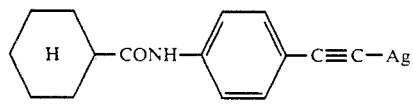 (50)
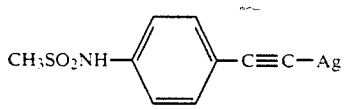 (51)
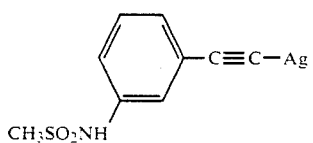 (52)
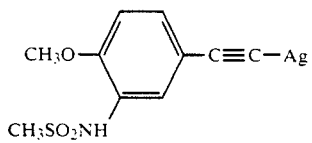 (53)
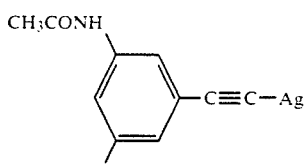 (54)
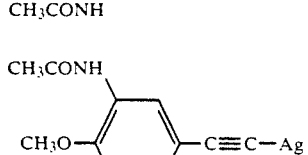 (55)
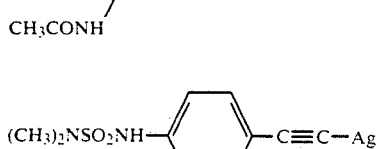 (56)
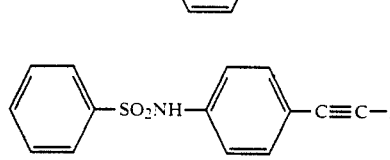 (57)
-continued
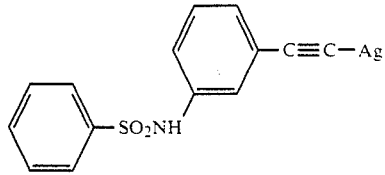 (58)
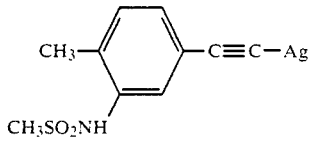 (59)
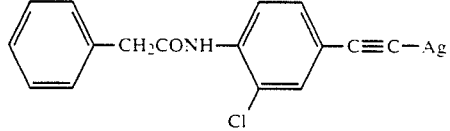 (60)
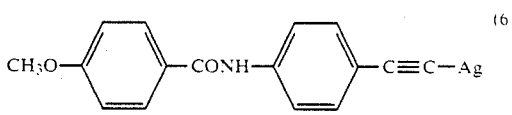 (61)
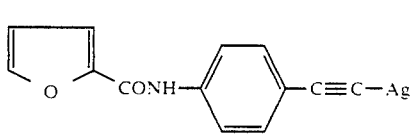 (62)
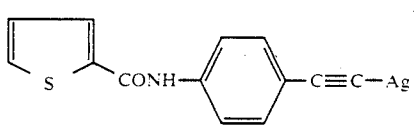 (63)
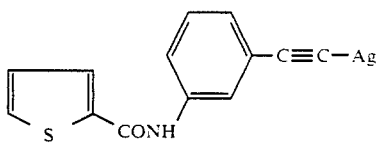 (64)
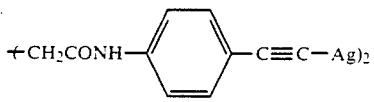 (65)
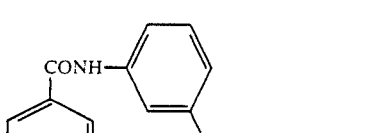 (66)
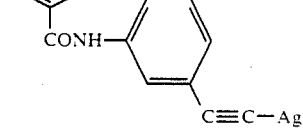

-continued

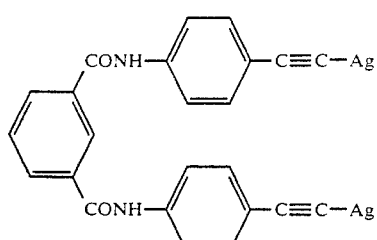 (67)

$CH_3O-CH_2-CH_2-OCH_2C\equiv C-Ag$ (68)

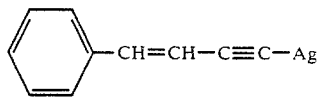 (69)

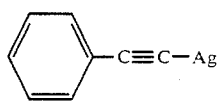 (70)

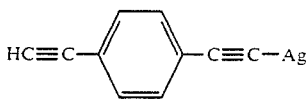 (71)

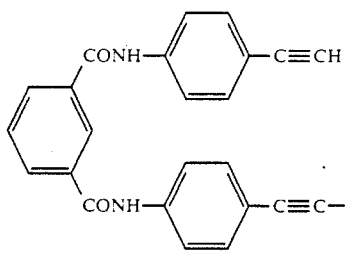 (72)

In addition, such silver halide particles as having a sensitivity of 1/100 or less of photosensitive silver halides are also effective as the non-photographic silver salts of the present invention, and in particular, those which have not been chemically sensitized are preferably effective.

The size of the non-photographic silver salts of the present invention is preferably 0.5 μm or less, and more preferably 0.2 μm or less.

Silver halides which can be used as non-photosensitive silver salts include silver chloride, silver bromochloride, silver bromoiodide, silver iodide, and silver bromoiodochloride, and in particular, silver halides containing silver chloride, such as silver chloride, silver bromochloride, or silver bromoiodochloride are preferred.

In the photographic materials of the present invention, a polymeric compound may be formed in either of exposed parts and non-exposed parts, depending upon the kind of the used photosensitive silver halides. The part (microcapsules) where the polymeric compound is formed has, in general, increased water-proofness, solvent-resistance, heat-resistance, and pressure-resistance higher than the other part (microcapsules) where the polymeric compound is not formed, and consequently, the latter part where the polymeric compound is not formed may be transferred to an image-receiving material under pressure, whereby an image may be formed from the coexisting color image-forming substance. According to the present invention, therefore, either a negative-type image or a positive-type image may freely be formed corresponding to the original, depending upon the kind of the used photosensitive silver halides and the color image-formation step applied to the photographic materials, and as the case may be, both negative-type and positive-type images may be formed at the same time.

For instance, in case the part where a polymeric compound is not formed is transferred to form a color image, a positive-type image may be obtained corresponding to the original when a general negative-type silver halide emulsion is used. On the other hand, in case a negative-type image is to be formed, an internal image-type silver halide emulsion as described in U.S. Pat. Nos. 2,592,250, 3,206,313, 3,367,778, and 3,447,927, or a mixture comprising a surface image-type silver halide emulsion and an internal image-type silver halide emulsion, as described in U.S. Pat. No. 2,996,382, may be used.

Silver halides which may be used in the present invention may be any of silver chloride, silver bromide, silver iodide or silver bromochloride, silver iodochloride silver bromoiodide or silver bromoiodochloride. The halogen composition in the silver halide particles may comprise a multi-layer constitution composed of different surface and inner compositions, such as those described in Japanese Patent Application (OPI) Nos. 154232/82, 108533/83, 48755/84, and 52237/84, U.S. Pat. No. 4,433,048, and European Patent 100,984. The particles may be plate-like particles having a thickness of 0.5 μm or less, a particle diameter of at least 0.6 μm, and an average aspect ratio of 5 or more, such as those described in U.S. Pat. Nos. 4,414,310 and 4,435,499 and German Patent Application (OLS) No. 3,241,646A1, etc. In addition, a mono-dispersed emulsion having a nearly uniform particle size distribution may also be used in the present invention, such as those described in Japanese Patent Application (OPI) Nos. 178235/82, 100846/83, and 14829/83, International Patent Application No. 83/02338A1, European Patents 64412A3 and 83377A1, etc.) Two or more kinds of silver halides having different crystal habits, halogen compositions, particle size, and particle size distributions may be used together. In addition, two or more kinds of mono-dispersed emulsions having different particle sizes may be blended, so as to properly regulate the gradation of the images formed.

The particle size of the silver halides to be used in the present invention is preferably from 0.001 to 10 μm (average particle size), more preferably from 0.001 to 5 μm. The silver halide emulsion may be prepared in any conventional means such as an acid method, a neutral method or an ammonia method. For the reaction of a soluble salt and a soluble halogen salt, any of one-component-addition mixture method or a simultaneous-mixture method or a combination thereof may be used. In addition, a reverse-mixture method where silver halide particles are formed in the presence of an excess silver ion, or a controlled-double-jet method where the value of pAg is kept constant may also be used therefor. In order to accelerate the growth of silver halide particles in the reaction, the concentration of the silver salt and halogen salt to be added as well as the amount thereof and the adding speed thereof may be elevated appropriately, as described in Japanese Patent Application (OPI) Nos. 142329/80 and 158124/80 and U.S. Pat. No. 3,650,757.

Silver halide particles of epitaxial over-grown type may also be used in the present invention, as described in Japanese Patent Application (OPI) No. 16124/81 and U.S. Pat. No. 4,094,684.

In the step of forming silver halide particles to be used in the present invention, a solvent for dissolving a silver halide may be used, such as ammonia or an organic thioether derivative as described in Japanese Patent Publication No. 11386/72 or a sulfur-containing compound as described in Japanese Patent Application (OPI) No. 144319/78. During the step of formation of silver halide particles or physical ripening thereof, a cadmium salt, a zinc salt, a lead salt, a thallium salt, etc., may be co-used.

In addition, in order to improve any high intensity reciprocity law failure or low intensity reciprocity law failure, a water-soluble iridium salt such as iridium (III, IV) chloride or ammonium hexachloroiridate, or a water-soluble rhodium salt such as rhodium chloride may further be used.

The silver halides are used in the form of an emulsion in the present invention, and any soluble salts may be removed from the silver halide emulsion, after the formation of silver halide precipitates or after the physical ripening thereof, which may be carried out by noodle washing or by precipitation method.

The silver halide emulsion may be used without being post-ripened, but in general, the emulsion is used after being chemically sensitized. For instance, the emulsion may be ripened by a conventional sulfur sensitization, reduction sensitization, or noble metal sensitization, or a combination of the conventional sensitization means, which is generally applied to emulsions of conventional photographic materials. The above chemical sensitization may be carried out in the presence of a nitrogen-containing heterocyclic ring compound (as described, for example, in Japanese Patent Application (OPI) Nos. 126526/83 and 215644/83).

The silver halide emulsion to be used in the present invention may be any one of a surface-latent image-type where a latent image is formed mainly on the surface of silver halide particles, or an internal-latent image-type where a latent image is formed mainly in the inner part of the particles. In addition, a direct reversal emulsion comprising a combination of the internal-latent image-type emulsion and nucleus-forming agent may also be used in the present invention. Various kinds of internal-latent image-type emulsions which are suitable for the purpose are described, for example, in U.S. Pat. Nos. 2,592,250 and 3,761,276, Japanese Patent Publication No. 3534/83, and Japanese Patent Application (OPI) No. 136641/82, etc.

Preferred nucleus-forming agents which may be used in the present invention in combination with the internal-latent image-type emulsion are described, for example, in U.S. Pat. Nos. 3,227,552, 4,245,037, 4,255,511, 4,266,013, and 4,276,364 and German Patent Application (OLS) No. 2,635,316.

The amount of the photographic silver halide to be coated in the photosensitive materials of the present invention falls within the range of 1 mg/m$^2$ to 10 g/m$^2$, as calculated in terms of the content of silver therein.

The non-photosensitive silver substance is generally used in the present invention in an amount of from 0.01 to 10 moles, and preferably from 0.01 to 1 mole, per mole of the photosensitive silver halide. The total amount of the photosensitive silver halide and the non-photosensitive silver salt to be coated in the photographic material of the present invention is suitably from 1 mg/m$^2$ to 10 g/m$^2$.

The silver halides to be used in the present invention may be spectrally sensitized with a sensitizer dye, etc. Sensitizer dyes which may be used for the spectral sensitization include methine dyes, cyanine dyes, merocyanine dyes, complex cyanine dyes, complex merocyanine dyes, holo-polar cyanine dyes, hemi-cyanine dyes, styryl dyes and hemioxonole dyes. Especially preferred dyes are cyanine dyes, merocyanine dyes, and complex merocyanine dyes. These dyes may contain any conventional basic heterocyclic nucleus, which is generally contained in conventional cyanine dyes, including pyrroline nucleus, oxazoline nucleus, thiazoline nucleus, pyrrole nucleus, oxazole nucleus, thiazole nucleus, selenazole nucleus, imidazole nucleus, tetrazole nucleus, pyridine nucleus, etc.; alicyclic hydrocarbon ring-fused nuclei of the above nuclei; and aromatic hydrocarbon ring-fused nuclei of the above nuclei, such as indolenine nucleus, benzindolenine nucleus, indole nucleus, benzoxazole nucleus, naphthoxazole nucleus, benzothiazole nuclues, naphthothiazole nucleus, benzoselenazole nucleus, benzimidazole nuclues, quinoline nucleus, etc. These nuclei may optionally have substituent(s) on their carbon atom(s).

Merocyanine dyes and complex merocyanine dyes may contain a ketomethylene-structural nucleus, such as a 5- to 6-membered heterocyclic nucleus of pyrazoline-5-one nucleus, thiohydantoin nucleus, 2-thio-oxazolidine-2,4-dione nucleus, thiazolidine-2,4-dione nucleus, rhodanine nucleus, thio-barbituric acid nucleus, etc.

The sensitizer dyes may be used singly, or may be used in the form of a combination of two or more of the sensitizer dyes. The combination use of the sensitizer dyes is often utilized for the purpose of supersensitization.

The photographic emulsions of the present invention may further contain, together with the sensitizer dye, a dye which per se does not have any spectral sensitization activity or a substance which does not substantially absorb any visible rays, but rather has a supersensitization activity. For example, the present emulsions may contain an aminostyryl compound substituted with a nitrogen-containing heterocyclic group (e.g., as described in U.S. Pat. Nos. 2,933,390 and 3,635,721), an aromatic organic acid/formaldehyde condensation product (e.g., as described in U.S. Pat. No. 3,743,510), a cadmium salt, an azaindene compound, etc. In particular, the combinations as described in U.S. Pat. Nos. 3,615,613, 3,615,641, 3,617,295, and 3,635,721 are especially preferred.

In order to incorporate the sensitizer dye into the silver halide photographic emulsion of the present invention, the dye may be directly dispersed in the emulsion, or alternatively, the dye is first dissolved in a solvent such as water, methanol, ethanol, acetone, or methylcellosolve or a mixture thereof and thereafter the resulting solution is added to the emulsion. Also, the sensitizer dye may be first dissolved in a solvent which is substantially incompatible with water such as phenoxyethanol, and the resulting solution is dispersed in water or in a hydrophilic colloid, and thereafter the resulting dispersion is added to the emulsion. Another means for incorporation of the sensitizer dye into the present photographic emulsion is that the sensitizer dye is admixed with an oleophilic compound such as a dye-forming compound, and thus the sensitizer dye is incorporated in the emulsion together with the dye-forming compound. When the sensitizer dye is dissolved, the other sensitizer dyes which are to be used together may be dissolved separately in a separate solvent, or alternatively, a mixture of sensitizer dyes to be used together may be dissolved in the same solvent.

When the sensitizer dye is added to an emulsion, two or more sensitizer dyes may be added simultaneously in the form of a mixture thereof, or each sensitizer dye may be added separately, or the sensitizer dye may be added together with any other additives being used. Regarding the time when the sensitizer dye is to be added to the emulsion, the dye may be added thereto during chemical ripening or before or after the chemical ripening, or otherwise, the dye may be added to the emulsion before or after the formation of silver halide grain nuclei, according to the method of U.S. Pat. Nos. 4,183,756 or 4,225,666.

The amount of the sensitizer dye to be added to the emulsion is, in general, from $10^{-8}$ to $10^{-2}$ mole or so, per mole of photosensitive silver halide.

Examples of reducing agents which may be used in the present invention are compounds as described in Japanese Patent Publication Nos. 20741/72, 11149/70, 10697/74, 138632/82, and 169143/83, for example, including resorcinols, aminophenols, phenylenediamines, 5-pyrazolones, alkylphenols, alkoxyphenols, naphthols, aminonaphthols, naphthalenediols, alkoxynaphthols, and hydrazines.

Specific examples of the reducing agents are resorcinol, orcinol, phloroglucinol, phloroglucinolmonomethyl ether, phloroglucinol-dimethylether, m-aminophenol, m-dimethylaminophenol, m-diethylaminophenol, N,N-dimethyl-m-phenylenediamine, N,N-diethyl-m-phenylenediamine, 3-methyl-5-pyrazolone, 3,4-dimethyl-5-pyrazolone, 1,3-dimethyl-5-pyrazolone, 1-phenyl-3-methyl-5-pyrazolone, p-ethylphenol, p-dodecylphenol, p-methoxyphenol, p-benzyloxyphenol, p-hydroxy-diphenyl-ether, 4-methyl-1-naphthol, 2-methyl-1-naphthol, 1-methyl-2-naphthol, 6-amino-1-naphthol, 8-amino-2-naphthol, 1,3-dihydroxynaphthalene, 4-methoxy-1-naphthol, o-tolyl-hydrazine hydrochloride, p-tolylhydrazine hydrochloride, acetohydrazide, benzohydrazide, toluenesulfonylhydrazine, N,N'-diacetylhydrazine, β-acylphenyl-hydrazines such as β-acetylphenylhydrazine, β-acetyl-p-tolylhydrazine, β-acetyl-p-methoxyphenylhydrazine, β-acetyl-p-aminophenylhydrazine, β-formyl-p-aminophenylhydrazine, β-formyl-2,4-dimethylphenylhydrazine, β-benzoyl-2,4-dimethoxyphenylhydrazine, β-butyroyl-p-tolyl-hydrazine, β-pivaloyl-p-acetylaminophenylhydrazine, β-propionyl-p-dimethylaminophenylhydrazine, β-ethoxycarbonyl-p-aminophenylhydrazine, β-dimethylcarbamoyl-p-benzenesulfonamidophenylhydrazine, β-morpholinocarbonyl-p-aminophenylhydrazine, etc.

The reducing agents may be used singly, or if necessary, in the form of a mixture of two or more thereof. In addition, these reducing agents may optionally be used together with other conventional photographic developers such as hydroquinones, catechols, p-substituted aminophenols, p-phenylenediamines, 3-pyrazolidones, etc.

The amount of the reducing agent to be added in the present invention may be widely varied, and is in general, from 0.1 to 1500 mole %, and preferably from 10 to 300 mole %, to the amount of the contained silver salts (the total amount of photosensitive silver halide and non-photosensitive silver salt).

Polymerizable compounds which may be used in the present invention are addition-polymerizable monomers and oligomers and polymers thereof. Addition-polymerizable monomers are compounds having one or more carbon-carbon unsaturated bonds. Examples of the compounds are acrylic acid and salts thereof, acrylates, acrylamides, methacrylic acid and salts thereof, methacrylates, methacrylamides, maleic anhydride, maleates, itaconates, styrenes, vinyl ethers, vinyl esters, N-vinylheterocyclic compounds, allyl ethers, and allyl esters and derivatives thereof.

All of the above compounds are usable in the present invention, and in particular, those which are hardly volatile when heated and have a boiling point of 80° C. or higher are preferred among them, as the photographic materials of the present invention are developed under heat. In addition, it is preferred to co-use a crosslinking compound having an activity of increasing the degree of hardening or the viscosity of the formed polymeric compounds, together with the polymerizable compounds, in order to elevate the contrast of the formed color images. Such crosslinking compounds are so-called poly-functional monomers having a plurality of vinyl groups or vinylidene groups in the molecule. Preferred examples of polymerizable compounds which may be used in the present invention include acrylic acid, methacrylic acid, butyl acrylate, methoxyethyl acrylate, butyl methacrylate, acrylamide, N,N-dimethylacrylamide, N,N-diethylacrylamide, N-acryloylmorpholine, N-acryloyl-piperidine, glycidyl acrylate, 2-ethylhexyl acrylate, acrylic acid anilide, methacrylic acid anilide, styrene, vinyltoluene, chlorostyrene, methoxystyrene, chloromethylstyrene, 1-vinyl-2-methylimidazole, 1-vinyl-2-undecylimidazole, 1-vinyl-2-undecylimidazoline, N-vinylpyrrolidone, N-vinylcarbazole, vinylbenzyl ether, vinylphenyl ether, methylene-bis-acrylamide, trimethylene-bis-acrylamide, hexamethylene-bis-acrylamide, N,N'-diacryloylpiperazine, m-phenylene-bis-acrylamide, p-phenylene-bis-acrylamide, ethylene glycol diacrylate, propylene glycol dimethacrylate, diethylene glycol diacrylate, polyethylene glycol diacrylate, bis(4-acryloxypolyethoxyphenyl)propane, 1,5-pentanediol diacrylate, neopentyl glycol diacrylate, 1,6-hexanediol acrylate, polypropylene glycol diacrylate, pentaerythritol triacrylate, trimethylolpropane triacrylate, pentaerythritol tetraacrylate, N-methylol-acrylamide, diacetone-acrylamide, triethylene glycol dimethacrylate, pentaerythritol tetraallyl ether.

In addition, condensation products of vinyl group- or vinylidene group-containing polymeric compounds (such as polymeric compounds having hydroxyl groups, amino groups, epoxy groups, halogen atoms, or sulfonyloxy groups in the side chains thereof) and acrylic acid, methacrylic acid, derivatives thereof may also be used in the present invention.

Further, compounds comprising the main nucleus of the above-described reducing agents and vinyl or vinylidene substituent as bonded to the nucleus, for example, m-N,N-di(acryloyloxyethyl)aminophenol or p-acryloyloxyethoxyphenol may also be used as the polymerizable compound in the present invention, and in this case, the compounds may act both as a reducing agent and as a polymerizable compound. In addition, compounds having vinyl group in the molecule of a color image-forming substance (such as dyes or leuco dyes) may also be used as the polymerizable compound, and in this case, the compounds may act both as a polymerizable compound and as a color image-forming substance in the present invention.

The amount of the polymerizable compound to be used in the present invention is from 5 to $1.2 \times 10^5$ parts by weight, preferably from 12 to $1.2 \times 10^4$ parts by weight, on the basis of the amount of the contained photosensitive silver halide.

Various kinds of color image-forming substances may be used in the present invention. For instance, dyes and pigments are mentioned as substances which themselves are colored. In the case that colored substances are used, the parts (microcapsules) where no polymeric compound is formed are broken and the imagewise formed dyes are transferred to an image-receiving material in an appropriate manner, whereby a desired color image may be obtained. Regarding the dyes and pigments to be used in the present invention, commercial products and other known dyes and pigments which are described in various literatures (for example, *Handbook of Dyes*, edited by Organic Synthetic Chemistry Association, 1970, Japan, and *Saishin Ganryo Binran* (*Modern Dye Handbook*), edited by Japan Pigment Technical Association, 1977, Japan) may be utilized. These dyes or pigments are dissolved or dispersed for use.

On the other hand, non-colored color image-forming substances may be classified into two groups comprising (1) substances which themselves are colorless or are somewhat colored in a pale-color but may color when some energy is imparted thereto, for example, by heating, pressure, or light-irradiation and (2) substances which themselves do not color even when some energy is imparted thereto, but may color when brought into contact with some other components. Examples of the former substances (1) are thermochromic compounds, piezochromic compounds, photochromic compounds and leuco forms of triarylmethane dyes, quinone dyes, indigoid dyes, and azine dyes, which are known. These substances may color when they are heated, pressed, irradiated by light, or aerially oxidized.

Examples of the latter substances (2) include various systems comprising two or more components which may be reacted to color, for example, by acid-base reaction, oxidation-reduction reaction, coupling reaction, or chelate-forming reaction. For instance, coloring system comprising a color former having a partial structure of a lactone, lactam, or spiropyran, and an acidic substance (developer) such as a terra alba or phenol compound, which is generally utilized in a pressure-sensitive paper; a system where an azo-coupling reaction between an aromatic diazonium salt or diazotate or diazosulfonate and a naphthol, aniline or active methylene compound is utilized; a chelate-forming reaction such as a reaction of hexamethylenetetramine, a ferric ion, and a gallic acid or a reaction of a phenolphthalein-Complexon and an alkaline earth metal ion; and an oxidation-reduction reaction such as a reaction of ferric stearate and pyrogallol or a reaction of a salt of behenic acid and 4-methoxy-1-naphthol may be used for the substances (2).

Another example of a coloring system for forming color by the reaction of two components is a reaction which proceeds under heat. In this case, microcapsules are to be broken under pressure whereby the two components contained therein are blended together, and at the same time or immediately after the application of pressure, the blended components are required to be necessarily heated.

Color formers in the color former-developer system include (1) triarylmethanes, (2) diphenylmethanes, (3) xanthenes, (4) thiazines, and (5) spiropyrans; and specific examples thereof are described, for example, in Japanese Patent Application (OPI) No. 27253/80. In particular, color formers of (1) triarylmethanes and (3) xanthenes are preferred among them, as being able to form images of high color density with less fog. Specific examples of the color formers are crystal violet-lactone, 3-diethylamino-6-chloro-7-($\beta$-ethoxyethylamino)fluoran, 3-diethylamino-6-methyl-7-anilinofluoran, 3-triethylamino-6-methyl-7-anilinofluoran, 3-cyclohexylmethylamino-6-methyl-7-anilinofluoran, 3-diethylamino-7-o-chloroanilinofluoran, etc.; and these may be used singly or in the form of a mixture of two or more thereof.

Developers which may be used in the present invention include phenol compounds, organic acids, or metal salts thereof, hydroxybenzoates and terra alba.

Examples of phenol compounds are 4,4'-isopropylidene-diphenol (bisphenol A), p-tert-butylphenol, 2,4-dinitrophenol, 3,4-dichlorophenol, 4,4'-methylene-bis-(2,6'-di-tert-butylphenol), p-phenylphenol, 1,1-bis(4-hydroxyphenyl)cyclohexane, 1,1'-bis(4-hydroxyphenyl)-2-ethylhexane, 2,2-bis(4-hydroxyphenyl)butane, 2,2'-methylenebis(4-tert-butylphenol), 2,2'-methylenebis($\alpha$-phenyl-p-cresol)thiodiphenol, 4,4'-thiobis(6-tert-butyl-m-cresol)sulfonyldiphenol, and p-tert-butylphenol/formalin condensation product and p-phenylphenol/formalin condensation product, etc.

Examples of organic acids and metal salt thereof are phthalic acid, phthalic anhydride, maleic acid, benzoic acid, gallic acid, o-toluic acid, p-toluic acid, salicylic acid, 3-tert-butylsalicylic acid, 3,5-di-tert-butylsalicyclic acid, 5-$\alpha$-methylbenzysalicyclic acid, 3,5-($\alpha$-methylbenzyl)salicylic acid, 3-tert-octyl-salicyclic acid and zinc, lead, aluminum, magnesium, or nickel salts of the acids, which are advantageous in the present invention. In particular, salicylic acid derivatives and zinc or aluminum salts thereof are preferred from the standpoint of the developability of the substances as well as the fastness of the developed images and the preservation stability of the recording sheets.

Examples of hydroxybenzoates are ethyl p-hydroxybenzoate, butyl p-hydroxybenzoate, heptyl p-hydroxybenzoate, and benzyl p-hydroxybenzoate.

Oil-absorptive white pigments may be co-used in the present color-formation system, with the result that the contents in the capsules may well be diffused and fixed.

Such developers are molted at a desired temperature, participating in the coloring reaction in the photographic materials of the present invention, and therefore, these are preferably added to the photographic materials in the form of an eutectic mixture with a hot-melting substance having a low melting point or in the form of developer particles coated with the low melting point-compound which is rendered molten and adhered to the surface of the particles.

Examples of the low melting point-compounds are higher fatty acid amides such as stearic acid amide, erucic amide, palmitic acid amide or ethylene-bisstearoamide, or waxes such as higher fatty acid esters, as well as phenyl benzoate derivatives, aromatic ether derivatives and urea derivatives, which are, however, in no way limitative.

Other examples of the color formers in the color former/developer system which may be applied to the photographic materials of the present invention are phenolphthalein, fluorescein, 2',4',5',7'-tetrabromo-3,4,5,6-tetrachlorofluorescein, tetrabromophenyl-blue, 4,5,6,7-tetrabromophenolphthalein, eosine, aurincresol-red, 2-naphthol-phenolphthalein, etc.

Developers include nitrogen-containing compounds such as inorganic or organic ammonium salts, organic amines, amides, ureas and thioureas and derivatives thereof, and thiazoles, pyrroles, pyrimidines, pieprazines, guanidines, indoles, imidazoles, imidazolines, triazoles, morpholines, piperidines, amidines, formamidines and pyridines. Specific examples of the compound are ammonium acetate, tricyclohexylamine, tribenzylamine, octadecylbenzylamine, stearylamine, allylurea, thiourea, methylthiourea, allylthiourea, ethylenethiourea, 2-benzylimidazole, 4-phenylimidazole, 2-phenyl-4-methyl-imidazole, 2-undecyl-imidazolidine, 2,4,5-trifuryl-2-imidazoline, 1,2-diphenyl-4,4-dimethyl-2-imidazoline, 2-phenyl-2-imidazoline, 1,2,3-triphenylguanidine, 1,2-ditolylguanidine, 1,2-dicyclohexylguanidine, 1,2-dicyclohexyl-3-phenylguanidine, 1,2,3-tricyclohexylguanidine, guanidine-trichloroacetate, N,N'-dibenzylpiperazine, 4,4'-dithiomorpholine, morpholinium trichloroacetate, 2-amino-benzothiazole, 2-benzoylhydrazinobenzothiazole, etc.

The color image-forming substance is preferably used in an amount of from 0.5 to 20 parts by weight, and especially preferably from 2 to 7 parts by weight, per 100 parts by weight of the polymerizable compound, in the photographic materials of the present invention.

The developer (reducing agent) is generally used in an amount of about from 0.3 to 80 parts by weight per 1 part by weight of the color former.

In the photographic materials of the present invention, a thermal polymerization-inhibitor may be incorporated into microcapsules to improve the preservation stability of the materials. The amount of the thermal polymerization-inhibitor to be added is generally from 0.1 to 10 mole % of the polymerizable compound.

The microcapsules to be used in the photographic materials of the present invention may be formed in a conventional manner which is well known in this technical field. For instance, various known methods may be applied to the formation of the microcapsules of the present invention, including a method of utilizing coacervation of hydrophilic wall-forming materials, as described in U.S. Pat. Nos. 2,800,457 and 2,800,458; an interfacial polymerization method as described in U.S. Pat. No. 3,287,154, British Patent 990,443, Japanese Patent Publication Nos. 19574/63, 446/67, and 711/67; a method for precipitation of polymers, as described in U.S. Pat. Nos. 3,418,250 and 3,660,304; a method of using isocyanate/polyol wall-materials, as described in U.S. Pat. No. 3,796,669; a method of using isocyanate wall-materials, as described in U.S. Pat. No. 3,914,511; a method of using urea/formaldehyde-type or urea/formaldehyde/resolcinol-type wall-materials, as described in U.S. Pat. Nos. 4,001,140, 4,087,376, and 4,089,802; a method of using wall-forming materials such as melamine/formaldehyde resins or hydroxypropyl-cellulose, as described in U.S. Pat. No. 4,025,455; a method of polymerization of monomers in situ, as described in Japanese Patent Publication No. 9168/61 and Japanese Patent Application (OPI) No. 9079/76; an electrolytic dispersion and cooling method, as described in British Patents 952,807 and 965,074; a spray-drying method as described in U.S. Pat. No. 3,111,407 and British Patent 930,422. These methods are in no way limitative in the present invention. In particular, it is preferred to first emulsify core substances, which are thereafter encapsulated with a polymeric substance film to form microcapsules, in the formation of the photographic materials of the present invention.

For the formation of microcapsule walls in the present invention, polymerization of reactants from the inner parts of oil drops for encapsulation to obtain microcapsules is especially effective. Thus, microcapsules which are favorable for photographic materials, as having a uniform grain size and an excellent fresh preservation-stability, may be obtained.

For instance, in case a polyurethane is used as a capsule-wall material, a polyisocyanate and a second substance to be reacted with the polyisocyanate to form a capsule wall (such as polyols, polyamines) are blended in an oily liquid to be encapsulated and the resulting mixture is emulsified and dispersed in water, and then, the temperature of the resulting dispersion is elevated to thereby initiate the polymeric compound-formation reaction in the surface of the oil drops to form the desired microcapsule walls therefrom. In this case, an auxiliary solvent having a low boiling point and a high solubility may be incorporated in the oily liquid.

Regarding the polyisocyanates and the other reactants of polyols and polyamines to be used in the capsule-formation method, various examples are described, for example, in U.S. Pat. Nos. 3,281,383, 3,773,695, and 3,793,268, Japanese Patent Publication Nos. 40347/73 and 24159/74, and Japanese Patent Application (OPI) Nos. 80191/73 and 84086/73, and the illustrated materials may be used in the present invention.

Examples of polyisocyanates are diisocyanates such as m-phenylene-diisocyanate, p-phenylene-diisocyanate, 2,6-tolylene-diisocyanate, 2,4-tolylene-diisocyanate, naphthalene-1,4-diisocyanate, diphenylmethane-4,4'-diisocyanate, 3,3'-dimethoxy-4,4'-biphenyldiisocyanate, 3,3'-dimethyl-diphenylmethane-4,4'-diisocyanate, xylylene-1,4-diisocyanate, 4,4'-diphenylpropane-diisocyanate, trimethylene-diisocyanate, hexamethylene-diisocyanate, propylene-1,2-diisocyanate, butylene-1,2-diisocyanate, cyclohexylene-1,2-diisocyanate, cyclohexylene-1,4-diisocyanate; triisocyanates such as 4,4',4''-triphenylmethane-triisocyanate, toluene-2,4,6-triisocyanate; tetraisocyanates such as 4,4'-dimethyldiphenylmethane-2,2',5,5'-tetraisocyanate; and isocyanate-prepolymers such as hexamethylene-diisocyanate/trimethylolpropane adduct, 2,4-tolylene-diisocyanate/trimethylolpropane adduct, xylylene-diisocyanate/trimethylolpropane adduct, tolylenediisocyanate/hexanetriol adduct, etc.

Polyols which may be used in the present invention include aliphatic or aromatic polyhydric alcohols, hydroxypolyesters, and hydroxy-polyalkyleneethers.

The following polyols as described in Japanese Patent Application (OPI) No. 49991/85 may be used in the present invention.

Ethylene glycol, 1,3-propanediol, 1,4-butanediol, 1,5-pentanediol, 1,6-hexanediol, 1,7-heptanediol, 1,8-octanediol, propylene glycol, 2,3-dihydroxybutane, 1,2-dihydroxybutane, 1,3-dihydroxybutane, 2,2-dimethyl-1,3-propanediol, 2,4-pentanediol, 2,5-hexanediol, 3-methyl-1,5-pentanediol, 1,4-cyclohexanediol, dihydroxycyclohexane, diethylene glycol, 1,2,6-trihydroxyhexane, 2-phenylpropylene glycol, 1,1,1-trimethylolpropane, hexanetriol, pentaerythritol, pentaerythritol/ethylene oxide adduct, glycerin/ethylene oxide adduct, glycerin/1,4-di(2-hydroxyethoxy)benzene, aromatic polyhydric alcohol/alkylene oxide condensation products such as resorcinol/dihydroxyethyl ether, p-xylylene glycol, m-xylylene glycol, $\alpha,\alpha'$-dihydroxy-p- diisopropylbenzene, 4,4'-dihydroxy-diphenylmethane, 2-(p,p'-dihydroxy-phenylmethyl)benzylalcohol, bisphenol A/ethylene oxide adduct, bisphenol A/propylene oxide adduct.

The polyols are used preferably in a ratio of from 0.02 to 2 moles of hydroxyl groups per mole of isocyanate group in the polyisocyanates.

Examples of polyamines are ethylenediamine, trimethylenediamine, tetramethylenediamine, pentamethylenediamine, hexamethylenediamine, p-phenylenediamine, m-phenylenediamine, piperazine, 2-methylpiperazine, 2,5-dimethylpiperazine, 2-hydroxy-trimethylenediamine, diethylenetriamine, triethylene-triamine, triethylenetetramine, diethylaminopropylamine, tetraethylpentamine, epoxy compound/amine adducts.

The polyisocyanates may be reacted with water to form polymeric compounds.

In the formation of microcapsules, water-soluble polymeric compounds may be used, which may be any of water-soluble anionic polymeric compounds, nonionic polymeric compounds and amphoteric polymeric compounds. Anionic polymeric compounds may be any of natural or synthetic compounds, for example, including those having —COO⁻ or —SO₃⁻ group.

Specific examples of anionic natural polymeric substances are gum arabic and alginic acids; and examples of anionic semi-synthetic polymeric substances are carboxymethyl cellulose, phthalated gelatin, sulfated starch, sulfated cellulose, and lignin sulfonic acid.

In addition, semi-synthetic substances further include optionally hydrolyzed maleic anhydride copolymers, acrylic or methacrylic acid polymers or copolymers, vinylbenzenesulfonic acid polymers or copolymers, and carboxy-modified polyvinyl alcohols. Nonionic polymeric substances include polyvinyl alcohol, hydroxyethyl cellulose, and methyl cellulose.

Amphoteric compounds include gelatins.

The water-soluble polymeric compounds may be used in the present invention, in the form of an aqueous solution of from 0.01 to 10 wt % concentration. The volume average grain size of microcapsules is regulated to be 20 $\mu$m or less.

The microcapsules of the present invention contain at least a polymerizable compound and a color image-forming substance. These microcapsules generally contain, together with the compound and substance, a silver halide and a reducing agent. For the encapsulation of the components, the silver halide and the reducing agent are dispersed or dissolved in the polymerizable compound having the color image-forming substance as dissolved therein to obtain an oily phase, which is blended with an aqueous phase containing a hydrophilic polymeric compound as dissolved therein and emulsified and dispersed, to obtain an emulsion. Simultaneously with the emulsification-dispersion or successively thereto, a wall layer is formed in the oil/water interface of the emulsion particles in a conventional known manner, whereby microcapsules containing the components may be formed. The formation of microcapsules is not limited to only the process and any other various appropriate processes may be utilized in the present invention.

The size of the microcapsules to be contained in the photographic materials of the present invention is 80 $\mu$m or less, preferably 20 $\mu$m or less from the point of preservation or handling of the materials. If the capsules are too small, however, these are in danger of being lost in the pores of the substrate or in the fibers. The lowermost limit of the size of the microcapsules depends upon the property of the substrate or the support and is preferably 0.1 $\mu$m or more, which is not critical.

The capsules to be used in the present invention are preferably those which do not substantially change when pressed under pressure of about 10 kg/cm² or less but may be ruptured when pressed under a pressure higher than the pressure. The pressure for rupturing the capsules may be changed, in accordance with the use of the photographic materials of the present invention and therefore is not specifically defined to any definite value. In general, it is preferred that the capsules may be ruptured under a pressure of about 500 kg/cm² or less. The pressure characteristic may appropriately be controlled, depending upon the particle diameter of the capsules, the thickness of the capsule walls and the kind of the capsule wall materials to be used.

The photographic materials of the present invention may contain, in order to modify the thermal reactivity thereof, hydroxy compounds, carbamate compounds, aromatic methoxy compounds or organic sulfonamide compounds, as described in Japanese Patent Application No. 25838/85, in the inside or outside of the microcapsules. The compounds are considered to vary the glass transition temperature of the microcapsule walls.

The photographic materials of the present invention may contain various kinds of image-formation accelerators. Image-formation accelerators have various kinds of functions, for example, to accelerate the oxidation-reduction reaction of a silver salt oxidizing agent and a reducing agent or to accelerate the transference of the formed dye from a photographic element layer to an image-receiving element layer. From the viewpoint of the physico-chemical functions of the accelerators, these may be classified into bases or base precursors, oils, hot-melting solvents, surfactants, and compounds having a mutual reactivity with silver or silver ion. In this connection, it is to be noted that the accelerator substances have in general composite functions and have two or more accelerating functions as mentioned above.

The image-formation accelerators can be classified in view of the functions thereof into groups, and examples of the thus-classified groups are illustrated hereunder. It is to be noted that the classification is not whatsoever critical, and in practice, compounds often have plural functions.

Examples of preferred bases are inorganic bases such as alkali metal or alkaline earth metal hydroxides, secondary or tertiary phosphates, borates, carbonates, quinolinates, metaborates; ammonium hydroxides; quaternary alkylammonium hydroxides; and other metal hydroxides; and organic bases such as aliphatic amines (e.g., trialkylamines, hydroxylamines, aliphatic polyamides); aromatic amines (e.g., N-alkyl-substituted aromatic amines, N-hydroxyalkyl-substituted aromatic amines, and bis[p-(dialkylamino)phenyl]methanes); heterocyclic amines, amidines, cyclic amidines, guanidines, cyclic guanidines, etc. Among them, those having a pKa value of 8 or more are especially preferred.

As base precursors, those capable of releasing a base through some reaction under heat are preferably used, including a salt of an organic acid and a base capable of decarboxylating under heat or a compound capable of releasing an amine due to intramolecular nucleophilic substitution-reaction, Lossen rearrangement, Beckmann rearrangement, or the like reaction. In addition, base precursors capable or releasing a base by electrolysis are also preferably used. Examples of preferred base precursors of the former type, which may release a base under heat, are salts of trichloroacetic acid, as described in British Patent 998,949; salts of α-sulfonylacetic acid as described in U.S. Pat. No. 4,060,420; salts of propiolic acids as described in Japanese Patent Application (OPI) No. 180537/84; 2-carboxycarboxamide derivatives as described in U.S. Pat. No. 4,088,496; salts of pyrolytic acids, in which an alkali metal or alkaline earth metal component is used besides an organic base, as a base component, as described in Japanese Patent Application (OPI) No. 195237/84; hydroxame-carbamates as described in Japanese Patent Application (OPI) No. 168440/84, in which Lossen rearrangement is utilized; aldoxime-carbamates capable of forming a nitrile under heat, as described in Japanese Patent Application No. 31614/83, etc. In addition, other base precursors as described in British Patent 998,945, U.S. Pat. No. 3,220,846, Japanese Patent Application (OPI) No. 22625/75, and British Patent 2,079,480 are also useful.

Examples of compounds which may release a base by electrolysis are described below.

For instance, electrolysis of various kinds of fatty acid salts is mentioned, which is typical means of electrolytic oxidation. By this reaction, carbonates of alkali metals or organic bases such as guanidines or amidines may be formed extremely efficiently.

Regarding electrolytic reduction, various means may be mentioned, including formation of amines by reduction of nitro and nitroso compounds; formation of amines by reduction of nitriles; formation of p-aminophenols, p-phenylenediamines, and hydrazines by reduction of nitro compounds, azo compounds and azoxy compounds, etc. p-Aminophenols, p-phenylenediamines, and hydrazines may be used not only as a base but also as a direct color image-formation substance. In addition, the formation of an alkali component by electrolysis of water in the presence of various kinds of inorganic salts may also be utilized in the present invention.

High boiling point-organic solvents which are used for emulsification and dispersion of hydrophobic compounds may be used as oils in the present invention.

Hot-melting solvents are those which are solid at room temperature but may melt at about a development temperature to be able to act as a solvent, including ureas, urethanes, amides, pyridines, sulfonamides, sulfons, sulfoxides, esters, ketones, ethers, or the like compounds, which are solid at 40° C. or less.

Regarding surfactants, pyridinium salts, ammonium salts, phosphonium salts as described in Japanese Patent Application (OPI) No. 74547/84, and polyalkylene oxides as described in Japanese Patent Application (OPI) No. 57231/84 may be mentioned.

Regarding compounds having mutual reactivity with silver or silver ion; imides, nitrogen-containing heterocyclic compounds as described in Japanese Patent Application (OPI) No. 177550/84, and thiols, thioureas, and thioethers as described in Japanese Patent Application (OPI) No. 111636/84 may be mentioned.

The image-forming accelerator may be incorporated in any one of a photographic material and an image-receiving material in the present invention or may be incorporated in both of the materials. For incorporation of the accelerator, this may be incorporated in any one of an emulsion layer, an intermediate layer, a protective layer, an image-receiving layer or the adjacent layers thereof. Another type of a photographic material having both a photographic layer and an image-receiving layer on one support may be analogously treated.

The image-formation accelerators may be used singly, or alternatively, several kinds of the accelerators may be used together, and in general, the latter case wherein a mixture of plural image-formation accelerators is used is preferred, resulting in achievement of a larger image-forming acceleration effect.

In particular, a combination use of a base or base precursor and some other accelerator is preferred, as an extremely remarkable image-forming acceleration effect may be attained.

In the present invention, various kinds of development-stopping agents may be used for the purpose of constantly obtaining a determined image, irrespective of the variation of treatment temperature and treatment time during heat-development.

The development-stopping agent used herein designates a compound which may rapidly neutralize a base or react therewith, after completion of sufficient development, to lower the base concentration which may mutually react with the existing silver or silver salt thereby to inhibit the development reaction. Examples of such development-stopping agents are acid precursors capable of releasing an acid under heat, electrophilic compounds capable of reacting (substitution-reaction) with a co-existing base under heat, nitrogen-containing heterocyclic compounds, mercapto compounds, etc. Specific examples of the acid precursors are oxime-esters as described in Japanese Patent Application (OPI) Nos. 108837/85 and 192939/85, and compounds capable of releasing an acid by Lossen rearrangement as described in Japanese Patent Application (OPI) No. 230133/85. Specific examples of the electrophilic compounds capable of reacting with a co-existing base under heat by substitution-reaction are those as described in Japanese Patent Application No. 85836/84.

The image-receiving element in the present invention is one to fix the color image-forming substance released from the photosensitive element thereon; and this may be provided on one support together with the photosensitive element, or alternatively, the image-receiving element may be provided on a different support to form an independent image-receiving material, separately form the photographic material having a photosensitive element.

The image-receiving element of the present invention may optionally have, if desired, at least one mordant agent-containing layer. In case the image-receiving element is positioned on the outermost surface layer in the materials of the present invention, a protective layer may be provided thereover. If desired, two or more layers each containing different mordant agents having a different mordantability may be provided in the element.

In case the image-receiving layer contains a mordant agent, the agent may be freely selected from conventional mordant agents which are generally used in diffusion-transfer type photographic materials. In particular, polymer mordant agents are preferred among them, including polymers containing a tertiary amino group, polymers having a nitrogen-containing heterocyclic ring, and quaternary cation-containing polymers thereof.

Polymers comprising tertiary amino group-containing vinyl monomer units are described in Japanese Patent Application (OPI) Nos. 60643/85 and 57836/85, and examples of polymers comprising tertiary imidazole group-containing vinyl monomers are described in Japanese Patent Application (OPI) Nos. 118834/85 and 122941/85 and U.S. Pat. Nos. 4,282,305, 4,115,124, and 3,148,061.

Preferred examples of polymers comprising quaternary imidazolium salt-containing vinyl monomer units are described in British Patents 2,056,101, 2,093,041, and 1,594,961, and U.S. Pat. Nos. 4,124,386, 4,115,124, 4,273,853, and 4,450,224, and Japanese Patent Application (OPI) No. 28225/73.

Preferred examples of polymers comprising other quaternary ammonium salt-containing vinyl monomer units are described in U.S. Pat. Nos. 3,709,690, 3,898,088, and 3,958,995 and Japanese Patent Application (OPI) Nos. 57836/85, 60643/85, 122941/85, 122942/85, and 235134/85.

In the encapsulation of the polymerizable compound and the color image-forming substance for the formation of the photographic materials of the present invention, solvents may be used. In case a reducing agent or a developer is incorporated in the necessary elements in the present invention, solvents may also be used. For instance, the components are dissolved in water or hydrophilic organic solvents and the resulting solution is directly coated on a support together with a binder, if desired, or the component may be directly introduced into the necessary elements in a conventional manner, for example, in accordance with the method as described in U.S. Pat. No. 2,322,027. In case solvents are used in microcapsules, the degree of the rupture of the microcapsules under pressure and the amount of the color image-forming substance which is contained in the microcapsules to be transferred to the image-receiving element may well be controlled. The amount of the solvents to be incorporated into the capsules is preferably from 1 to 500 parts by weight on the basis of 100 parts by weight of the co-existing polymerizable compound.

The solvents to be used in the present invention are natural oils or synthetic oils, which may be used singly or in the form of a mixture thereof. Examples of these solvents are cottonseed oil, kerosene oil, aliphatic ketones, aliphatic esters, paraffins, naphthene oil, alkyated biphenyls, alkylated terphenyl, chlorinated paraffins, alkylated naphthalenes, as well as diarylethanes (such as 1-phenyl-1-xylylethane, 1-phenyl-1-p-ethylphenylethane, 1,1'-ditolylethane), alkyl phthalates (such as dibutyl phthalate, dioctyl phthalate), phosphates (such as diphenyl phosphate, triphenyl phosphate, tricresyl phosphate, dioctybutyl phosphate), citrates (such as tributyl acetyl citrate), benzoates, (such as octyl benzoate), alkylamides (such as diethyl laurylamide), fatty acid esters (such as dibutoxyethyl succinate and dioctyl azelate), trimesates (such as tributyl trimesate), lower alkyl acetates (such as ethyl acetate and butyl acetate), ethyl propionate, secondary alcohols, methyl isobutyl ketone, β-ethoxyethyl acetate, methyl cellosolve acetate, cyclohexanone, etc.

The binders to be used in the photographic materials and image-receiving materials of the present invention may be incorporated therein in the form of a single binder or in the form of a combination of plural binders. The binders are preferably mainly hydrophilic, and transparent or semi-transparent hydrophilic binders are typical, including natural substances such as proteins (e.g., gelatin, gelatin derivatives, and cellulose derivatives) and polysaccharides (e.g., starch, bum arabic), and synthetic polymer substances such as water-soluble polyvinyl compounds (e.g., polyvinyl pyrrolidone, acrylamide polymers). In addition, other synthetic polymer substances such as vinyl polymer compounds are also useful, which may be used in the form of a latex of a dispersed vinyl polymer especially for the purpose of increasing the dimension stability of the photographic materials.

The supports to be used in the photographic materials and image-receiving materials of the present invention are those which are resistant to the treatment temperature. General supports which may be used in the present invention are glass, paper, paper of high quality, synthetic paper, metal, and analogues thereof, as well as acetylcellulose film, cellulose ester film, polyvinylacetal film, polystyrene film, polycarbonate film, polyethylene terephthalate film and the like films, and resin materials. In addition, a paper support laminated with a polymer such as polyethylene may also be used. In particular, polyester films as described in U.S. Pat. Nos. 3,634,089 and 3,725,070 are preferably used.

The photographic materials of the present invention may have, if desired, various auxiliary layers such as protective layer, intermediate layer, anti-static layer, curl-preventive layer, peeling layer and matting agent layer. In particular, the protective layer preferably contains an organic or inorganic matting agent for the purpose of anti-blocking.

The photographic materials and the image-receiving materials may further contain, if desired, an anti-fogging agent, a fluorescent whitening agent, a discoloration inhibitor, an anti-halation dye, an irradiation-preventive dye, a pigment (including a white pigment such as titanium oxide), a water-releasing agent, a thermal-polymerization inhibitor, a surfactant, a hot-melting solvent-dispersed vinyl compound, etc.

Various means may be used for the light-exposure of the photographic materials of the present invention. The latent image is formed in the photographic materials of the present invention by means of image-forming exposure with a radiation including visible rays. In general, a conventional light source may be used, and for example, sun light, strobo, flash, tungsten lamp, mercury lamp, halogen lamp (e.g., iodine lamp), xenon lamp, laser ray, CRT (cathode ray tube) light source, plasma light source, fluorescent lamp, light emitting diode or the like various kinds of light sources may be used. In addition, a light-exposure means comprising a combination of a micro-shutter array, which uses LCD (liquid crystal) or PLZT (lanthanum-doped titanium-lead zirconate), and a linear or plane light source may also be used in the present invention.

The kind of the light source to be used and the amount of the light-exposure therefrom may be properly selected in accordance with the photosensitive wavelength of the silver halides as sensitized with sensitizer dyes and the sensitivity thereof.

The originals to be used in the present invention may be any of black-and-white originals or color originals.

In addition, line originals such as drawings as well as photo-originals with gradation may also be used as the originals. Moreover, the photographic materials of the present invention may be used for taking pictures of portraits or landscapes with camera. The printing from the originals may be carried out by contact printing where the original and the photographic paper are kept in close contact with each other or by reflex printing or enlarging printing.

In addition, it is possible to print an image which has been photographed with a video-camera or an image information transferred from a TV-station, on the photographic materials of the present invention, by directly displaying the image or image formation with CRT or FOT (fiber optical tube) and then forming and printing the image formation on the photographic material by contact-printing or with lens.

LED (light emitting diode) has recently greatly progressed, and thus has become utilized as a light-exposure means or display means in various photographic instruments. Using LEDs, however, it is difficult to form an element capable of effectively emitting blue light. Therefore, when LED elements are used as a light source for reproduction of color images, three kinds of LEDs, each emitting a green light, a red light, and an infrared light, respectively, are generally used, and the photographic materials to be exposed with the LED's are so constructed that the emulsions which are sensitive to the lights may contain yellow, magenta, and cyan-image forming substances, respectively.

More particularly, the photographic materials are to be so constructed that the green-sensitive emulsion part contains an yellow-image-forming substance and that the red-sensitive emulsion port contains a magenta image-forming substance and that the infrared-sensitive emulsion part contains a cyan image-forming substance. It is a matter of course that any other different combinations than the above combination may also be applied to the photographic materials of the present invention.

In addition to the above-described means where the originals are contact-printed or projected, some other means may also be utilized in the present invention, where the original which has been irradiated with a light source is read with a light-receiving element such as phototube or CCD to be inputted into a memory element such as a computer and the input information is, if necessary, further processed for a so-called image treatment, and thereafter, the image information is reproduced in CRT and the reproduced image information is used as an image-light source, or otherwise, LED's (comprising the three kinds) are directly emitted on the basis of the processed information, and thus, the photographic material is exposed with the light source.

The amount of the light to be exposed in the means varies, depending upon the kind of the silver halides used in the photographic materials as well as upon the sensitized degree of the materials.

Regarding the heating means after the image-forming exposure in the present invention, conventional means which have heretofore been known in this technical field may be used. For instance, the photographic materials of the present invention may be brought directly into contact with a hot plate or a hot drum, or may be conveyed with a heat roller.

In addition, the materials may be heated with a hot air or by high frequency induction heating, or laser beams. Some kinds of photographic materials may be heated with an infrared-ray heater. Moreover, a heating method by the use of an eddy current to be produced by electromagnetic induction may also be applied to the present invention.

Further, the photographic materials may be heated in a liquid bath which is inert to the materials, for example, in a hot bath of a liquid of fluorine substance.

Apart from the aforesaid heating means, a heating source may be incorporated in the photographic materials, whereby the materials may be directly heated with the incorporated heat source. For instance, a layer of electroconductive particles such as carbon black or graphite is incorporated in the photographic materials, whereby the materials may be heated with the Joule's heat occurred when an electric current is imparted to the electroconductive layer.

The heating temperature in the heating is generally within the range of from 80° C. to 200° C., and preferably from 100° C. to 160° C.

Regarding the pattern for the heating of the photographic materials, various kinds of patterns may be applied to the materials of the present invention. For instance, a means for heating at a constant temperature is a most general embodiment. Depending upon the characteristics of the photographic materials to be heated, a so-called multi-stage heating, for example, comprising heating at a high temperature for a short period of time followed by gradual lowering of the heating temperature, is often effective to some kinds of photographic materials. In this multi-stage heating, the heating period is generally from 1 second to 5 minutes, and preferably from 5 seconds to 1 minute.

In the case that the photographic materials are easily influenced by air oxidation while heated, it is effective to degasify the surrounding part to be heated or to substitute the atmosphere over the part by an inert gas. The surface of the photographic material may be kept directly in contact with the heating element or may be exposed to air. In the case that the photographic material is developed while the front surface thereof is kept exposed to air, it is effective to provide a cover on the surface of the material for the purpose of preventing water or volatile components contained in the the material from evaporating therefrom or of well keeping the temperature of the material.

As explained in detail in the above-explanation, the present invention provides a photographic material containing a non-photosensitive silver salt comprising a photosensitive silver halide, a non-photosensitive silver salt, a reducing agent, a polymerizable compound and a color image-forming substance as provided on a support, wherein at least the polymerizable compound and the color image-forming substance are contained in the same microcapsule so that the color image-forming substance may be converted into an imagewise immobile state after the material has been imagewise exposed to light and then heated. The photographic material containing the non-photosensitive silver salt of the present invention may form color, images of high sensitivity by light-exposure for a short period of time followed by rapid dry photographic treatment.

Thus, the photographic material of the present invention may form color images with selective absorption of any light generally within the range of from 450 to 900 nm.

The present invention will be explained in greater detail by reference to the following examples, which, however, are not intended to be interpreted as limiting the scope of the present invention.

EXAMPLE 1

Preparation of Image-Receiving Material

A kneaded and milled mixture comprising 65 parts of light calcium carbonate, 35 parts by aluminum hydroxide (H-10, by Showa Denko Co.), 1.8 parts of styrene-/α-methylstyrene decamer and 8.2 parts of lead 3,5-di-α-methylbenzylsalicylate, and 10 parts of zinc oxide and 1 part of sodium hexamethaphosphate were dispersed in 200 ml of water and milled in a sand mill to obtain a dispersion solution containing particles having an average grain size of 2.6 μm. To this were added 9 parts of polyvinyl alcohol, 20 parts of carboxy-modified SBR-latex (48%), and 100 parts of water and the combination was well stirred.

The stirred combination was coated on a raw paper having a weight of 43 g/m², in a solid weight of 5.2 g/m² and dried at 90° C.

Preparation of Non-Photosensitive Silver Salt (a) Silver benzotriazole:

6.5 g of benzotriazole and 10 g of gelatin were dissolved in 1000 ml of water. The solution formed was kept at 50° C. and stirred.

Next, a solution of 8.5 g of silver nitrate dissolved in 100 ml of water was added to the above-obtained solution in the course of 2 minutes.

The pH of the resulting solution was adjusted for precipitation to remove the unnecessary salts therefrom, and the pH was adjusted to 6.0, to obtain 400 g (yield) of silver benzotriazole.

(b) p-acetaminophenylacetylene silver:

5.9 g of p-acetaminophenylacetylene and 20 g of gelatin were dissolved in a mixture solution comprising 300 ml of ethanol and 1000 ml of water. The solution formed was kept at 50° C. and stirred.

Next, a solution of 4.5 g of silver nitrate dissolved in 100 ml of water was added to the above-obtained solution in the course of 2 minutes.

The pH of the resulting solution was adjusted for precipitation to remove the unnecessary salts therefrom, and the pH was adjusted to 6.4, to obtain 300 g (yield) of p-acetaminophenylacetylene silver.

(c) Non-photosensitive silver chloride:

3.4 g of sodium chloride and 40 g of gelatin were dissolved in 1000 ml of water. The solution formed was kept at 40° C. and stirred.

Next, a solution of 34.4 g of sodium chloride dissolved in 600 ml of water and a solution of 100 g of silver nitrate dissolved in 600 ml of water were simultaneously added to the above-obtained solution at an addition speed of 150 ml/min. in the course of 4 minutes.

The pH of the resulting solution was adjusted for precipitation to remove the unnecessary salts therefrom, and the pH was adjusted to 6.4, to obtain 600 g of non-photosensitive silver chloride.

(d) Non-photosensitive silver bromide:

7 g of potassium bromide and 40 g of gelatin were dissolved in 1000 ml of water. The obtained solution was kept at 40° C. and stirred.

Next, a solution of 70 g of potassium bromide dissolved in 600 ml of water and a solution of 100 g of silver nitrate dissolved in 600 ml of water were simultaneously added to the above-obtained solution at an addition speed of 150 ml/min. in the course of 4 minutes.

The pH of the resulting solution was adjusted for precipitation to remove the unnecessary salts therefrom, and the pH was adjusted to 6.4, to obtain 600 g of non-photosensitive silver bromide.

Silver Bromoiodide Emulsion 20 g of gelatin, 9.52 g of KBr and 3.32 g of KI were dissolved in 1000 ml of $H_2O$. The solution obtained was kept at 50° C. and stirred.

A solution of 17 g of $AgNO_3$ as dissolved in 100 ml $H_2O$ was added to the above-obtained solution in the course of 10 minutes. Next, the resulting solution was cooled to 35° C. and the pH value thereof was adjusted for precipitation of the emulsion and the excess salts were removed out therefrom.

Next, the pH was adjusted to 6.0 to obtain 200 g (yield) of AgBrI (iodine content: 20 mole %) emulsion.

Preparation of Packet Emulsion 5 g of N,N'-diacryloylpiperazine, 10 ml of phenylxylylethane and 10 ml of tricresyl phosphate, 3 g of pentaerythritol tetraacrylate, 1 g of 3,3-bis-(1-ethyl-2-methyl-3-indolyl) phthalide were blended and dissolved, and the resulting mixture was emulsified and dispered in 110 g of 10% gelatin containing 0.5 g of sodium dodecylbenzene-sulfonate, to obtain a dispersion containing a color image-forming substance.

To 4 g of the above-obtained silver bromoiodide emulsion was added a methanol solution containing 3,3'-di(γ-sulfopropyl)-5,5'-diphenyl-9-ethyloxacarbocyanine sodium salt ($4 \times 10^{-4}$ mole per mole of silver halide), and the mixture was stirred for 5 minutes. Thereafter, 20 g of the color image-forming substance dispersion and 10 g of the silver benzotriazole emulsion as obtained above were added thereto and blended.

Next, 30 ml of 10% gum arabic aqueous solution and 100 ml of water were added thereto, and the mixture was adjusted to a pH value of 4.80 with 1% acetic acid aqueous solution, while being stirred at 45° C.

After stirred for 15 minutes, the mixture was cooled to 7° C. and further stirred for 30 minutes. 150 ml of water containing 0.14 g chromium alum was added thereto and the mixture was further stirred for 1 hour, and thereafter, 5% sodium carbonate aqueous solution was added thereto and the resulting mixture was allowed to stand overnight. Then, the supernatant liquid was removed by decantation.

The yield of the packet emulsion thus prepared was 90 g and the particles contained therein had an average grain size of about 10 μm.

This packet emulsion was called "P-1".

In the same manner as above, other packet emulsions "P-2", "P-3", and "P-4" were prepared analogously, with the exception that 30 g of p-acetaminophenylacetylene silver was used in the "P-2", that 3 g of non-photosensitive silver chloride emulsion was used in the "P-3" and that 3 g of non-photosensitive silver bromide emulsion was used in the "P-4" in place of silver benzotriazole in the "P-1".

In addition, another packet emulsion "P-0" was also prepared, which did not contain any non-photosensitive silver salt.

Preparation of Photosensitive Materials

A coating solution each containing one of the above-prepared packet emulsions "P-0" through "P-4" was coated on a polyethelene terephthalate film to form a coated-layer having a wet layer thickness of 50 μm. After dried, a gelatin-protective layer (containing 1 g/m² of gelatin and 0.5 g/m² of m-dimethylaminophenol) was coated thereover, to obtain photographic material samples. These were called photographic material samples "K-0" through "K-4", corresponding to the respective coating solutions.

Each of these photographic material samples was exposed to a green light using a filter, and then uniformly heated for 10 seconds or 20 seconds at 120° C.

Then, each of the thus-exposed samples was laminated with an image-receiving material and pressed by passing through pressure rollers.

The reflection density of the formed image in each sample was measured with Macbeth Reflection-Densitometer (RD-519). The results obtained are shown in Table 1.

TABLE 1

| Sample No. | Reflection Density | |
|---|---|---|
| | (Heated for 10 sec.) Non-exposed part/ Exposed part | (Heated for 20 sec.) Non-exposed part/ Exposed part |
| K-0 (comparison) | 1.30/1.10 | 1.25/1.00 |
| K-1 (invention) | 1.30/0.70 | 1.15/0.30 |
| K-2 (invention) | 1.30/0.20 | 1.25/0.10 |
| K-3 (invention) | 1.28/0.50 | 1.28/0.20 |
| K-4 (invention) | 1.30/0.65 | 1.30/0.30 |

Table 1 shows that the difference of the density between the non-exposed part and the exposed part is large in the photographic materials of the present invention containing a non-photosensitive silver salt. In particular, this difference is especially remarkable in the sample containing p-acetoaminophenyl-acetylene silver. This tendency corresponded not only to the compound but also to all of other acetylene silver compounds. Comparing the samples containing a non-photosensitive silver halide with each other, it is noted that silver chloride is somewhat more effective than silver bromide in view of the remarkable difference of the density between the non-exposed parts and the exposed parts of the samples.

EXAMPLE 2

Preparation of Silver Bromochloride Emulsion

The following solutions were first prepared:
(Solution A): 10 g of gelatin and 3 g of sodium chloride were dissolved in 1000 ml of water.
(Solution B): 100 g of silver nitrate was dissolved in water to make 600 ml in total volume.
(Solution C): 6 g of sodium chloride and 56 g of potassium chloride were dissolved in water to make 600 ml in total volume.

Solution A was put in a reactor and Solution B and Solution C were simultaneously added thereto, while kept at 75° C., in the course of 40 minutes. Thus, a monodispersed cubic silver bromochloride emulsion having an average grain size of 0.35 μm was prepared, and this was washed with water and then demineralized, and thereafter, this was chemically sensitized with sodium thiosulfate and 4-hydroxy-6-methyl-1,3,3a,7-tetrazaindene. The yield of the formed emulsion was 600 g.

Preparation of Microcapsules and Manufacture of Photosensitive Sheets

To a monomer mixture comprising 28 g of trimethylolpropane triacrylate and 7 g of methyl methacrylate were added 0.03 g of β-acetyl-p-aminophenylhydrazine, 7.5 g of the silver bromochloride emulsion obtained above and 2.1 g of a color former of 3-diethylamino-6-chloro-7-anilinofluoran, and the mixture was dissolved to obtain a monomer mixture.

On the other hand, a mixture comprising 17.5 g of 10% gum arabic aqueous solution, 18.8 g of 12% isobutylene/maleic anhydride aqueous solution, and 26.8 g of distilled water was adjusted to a pH value of 3.5 with sulfuric acid; and 4.6 g of urea and 0.6 g of resorcinol were added thereto. Next, the above-prepared monomer mixture was emulsified and dispersed in the thus formed solution, to obtain an emulsion containing particles having a grain size of 3 μm. Next, 12.9 g of 36% formalin (i.e., a 36 wt % solution of formaldehyde) was added to the resulting emulsion and stirred and heated up to 60° C. After kept for one hour, 9.0 g of 5% ammonium sulfate aqueous solution was added thereto, and the mixture was stirred further for 1 hour while keeping at 90° C., and then cooled. Thereafter, the emulsion was adjusted to a pH value of 9.0 with NaOH.

To 5 g of the thus-formed capsule solution were added 1.53 g of 15% polyvinyl alcohol aqueous solution, 3.47 g of distilled water, and 0.57 g of starch, to form a coating solution. This was coated on a coat paper by the use of a Coating Rod 10 (17.5 cc/m² of coating amount), and dried at 50° C. for 15 minutes, to obtain a photographic sheet "K-5".

In the same manner as above, with the exception that 7 g of silver benzotriazole, 20 g p-acetaminophenylacetylene silver, 2 g of non-photosensitive silver chloride or 2 g of non-photosensitive silver bromide, which were prepared in the above Example 1, was added, photographic sheets "K-6", "K-7", "K-8", and "K-9" were prepared, respectively.

Manufacture of Image-Receiving Sheet

To 21.8 g of water were added 0.6 g of 48% SBR (styrene butyl rubber) latex, 4 g of 10% etherified starch aqueous solution, 2.1 g of zinc carbonate, 1.3 g of 50% sodium silicate aqueous solution, 0.1 g of sodium hexameta-phosphate, and 13 g of Siltone F-242 clay, and the mixture was stirred in a homogenizer for 15 minutes.

The formed mixture was coated on an art paper with a Coating Rod 18 (31.5 cc/m² of coating amount) and dried for 2 minutes at 100° C., to obtain an image-receiving sheet.

The above-prepared photographic sheets "K-5" through "K-9" were exposed to blue light and then heated for 10 seconds or 20 seconds at 120° C.

Each of the thus-exposed photographic sheets was laminated with the above-prepared image-receiving sheet so that both of the coated surfaces faced to each other, and pressed by passing through pressure rollers under a linear pressure of 100 kg/cm. The reflection density of the black image formed in each sample was measured by the use of Macbeth Reflection Densitometer (RD-519). The results obtained are set forth in Table 2.

TABLE 2

| Sample No. | Reflection Density | |
|---|---|---|
| | (Heated for 10 sec.) Non-exposed part/ Exposed part | (Heated for 20 sec.) Non-exposed part/ Exposed part |
| K-5 (comparison) | 1.25/1.00 | 1.20/0.80 |
| K-6 (invention) | 1.30/0.65 | 1.20/0.25 |
| K-7 (invention) | 1.30/0.25 | 1.25/0.10 |
| K-8 | 1.30/0.50 | 1.30/0.20 |

TABLE 2-continued

| | Reflection Density | |
|---|---|---|
| Sample No. | (Heated for 10 sec.) Non-exposed part/ Exposed part | (Heated for 20 sec.) Non-exposed part/ Exposed part |
| (invention) K-9 (invention) | 1.30/0.65 | 1.30/0.25 |

Table 2 shows that the difference of the density between the non-exposed part and the exposed part is large in the photographic materials of the present invention containing a non-photosensitive silver salt. Thus, it is noted that the discrimination is remarkably improved in the present photographic materials. In this experiment of the Example 2, it is also noted that the sample containing p-acetaminophenylacetylene silver is better than the other samples, like as the aforesaid Example 1. Comparing the samples containing a non-photosensitive silver halide with each other, it is noted that silver chloride is somewhat more effective than silver bromide, as in Example 1.

The effects of the present invention are apparent from the above experimental data.

While the invention has been described in detail and with reference to specific embodiments thereof, it will be apparent to one skilled in the art that various changes and modifications can be made therein without departing from the spirit and scope thereof.

What is claimed is:

1. An image recording method which comprises imagewise exposing a photographic material comprising a support having provided thereon a light-sensitive layer containing at least a photosensitive silver halide, a non-photosensitive silver salt, a reducing agent, a polymerizable compound having one or more carbon-carbon unsaturated bonds, and a color image-forming substance, wherein at least said polymerizable compound and said color image-forming substance are encapsulated in the same microcapsules to form a latent image in the photosensitive silver halide without causing polymerization of the polymerizable compound and heating the photographic material either simultaneously with or after the imagewise exposure to polymerize the polymerizable compound to thereby cure the microcapsules, wherein said non-photosensitive silver salt is selected from compounds represented by formula (I)

$$R-C\equiv C-Ag \quad (I)$$

wherein R represents a substituted or unsubstituted alkyl group, cycloalkyl group, alkenyl group, alkylnyl group, aralkyl group, aryl group, or heterocyclic group or non-photosensitive silver halide particles which have not been chemically sensitized.

2. A method as in claim 1, wherein R in formula (I) represents a substituted or unsubstituted phenyl group.

3. A method as in claim 1, wherein said non-photosensitive silver salt is selected from one or more of silver halide particles of silver chloride, silver bromochloride, silver bromoiodide, silver iodide, and silver bromoiodochloride.

4. A method as in claim 1, wherein said color image-forming substance is used in an amount of from 0.5 to 20 parts by weight per 100 parts by weight of the polymerizable compound, said non-photosensitive silver salt is used in an amount of from 0.01 to 10 moles per mole of the photosensitive silver halide, said polymerizable compound is used in an amount of from 5 to $1.2 \times 10^5$ parts by weight per part by weight of the photosensitive silver halide, and said reducing agent is used in an amount of from 0.1 to 1500 mole % to the total amount of photosensitive silver halide and non-photosensitive silver salt.

5. A method as in claim 1, wherein the photosensitive silver halide and non-photosensitive silver halide are used in a total amount of from 1 mg/m$^2$ to 10 g/m$^2$ based on the amount of silver, and from 0.01 to 10 moles of the non-photosensitive silver halide are used per mole of the photosensitive silver halide.

6. A method as in claim 1, wherein the color image-forming substance is dyes, pigments, or color-forming agents which develop a color between two components.

7. A method as in claim 4, wherein said color image-forming substance is used in an amount of from 2 to 7 parts by weight per 100 parts by weight of the polymerizable compound, said non-photosensitive silver salt is used in an amount of from 0.01 to 1 mole per mole of the photosensitive silver halide, said polymerizable compound is used in an amount of from 12 to $1.2 \times 10^4$ parts by weight per part by weight of the photosensitive silver halide, and said reducing agent is used in an amount of from 10 to 300 mole % to the total amount of photosensitive silver halide and non-photosensitive silver salt.

8. An image recording method which comprises imagewise exposing a photographic material comprising a support having provided thereon a light-sensitive layer containing at least a photosensitive silver halide, non-photosensitive silver halide particles which have not been sensitized, a reducing agent, a polymerizable compound having one or more carbon-carbon unsaturated bonds, and a color image-forming substance, wherein at least said polymerizable compound and said color image-forming substance are encapsulated in the same microcapsules to form a latent image in the photosensitive silver halide without causing polymerization of the polymerizable compound and heating the photographic material either simultaneously with or after the imagewise exposure to polymerize the polymerizable compound to thereby cure the microcapsules.

* * * * *